(12) United States Patent
Lutley et al.

(10) Patent No.: US 6,288,948 B1
(45) Date of Patent: Sep. 11, 2001

(54) WIRED ADDRESS COMPARE CIRCUIT AND METHOD

(75) Inventors: James W. Lutley, Southampton; Neil P. Raftery, Guildford; Jonathan F. Churchill, Reading, all of (GB); Kenneth A. Maher, San Francisco, CA (US)

(73) Assignee: Cypress Semiconductor Corp., San Jose, CA (US)

( * ) Notice: Subject to any disclaimer, the term of this patent is extended or adjusted under 35 U.S.C. 154(b) by 0 days.

(21) Appl. No.: 09/539,903

(22) Filed: Mar. 31, 2000

(51) Int. Cl.$^7$ .................................................. G11C 8/00

(52) U.S. Cl. .................. 365/189.07; 365/189.12; 365/230.04; 365/230.09

(58) Field of Search .................. 365/189.07, 189.12, 365/230.04, 230.09

(56) References Cited

U.S. PATENT DOCUMENTS

| | | | |
|---|---|---|---|
| 3,753,244 | * | 8/1973 | Sumilas et al. .................. 340/172.5 |
| 5,623,437 | * | 4/1997 | Nogle et al. .................. 365/189.07 |
| 5,802,541 | * | 9/1998 | Reed .................................. 326/105 |
| 6,101,135 | * | 4/2000 | Lee .................................... 365/191 |

* cited by examiner

Primary Examiner—Son T. Dinh
(74) Attorney, Agent, or Firm—Christopher P. Maiorana, P.C.

(57) ABSTRACT

An apparatus comprising a first register, a second register and a plurality of compare circuits. The first register may be configured to store a plurality of first address bits. The second register may be configured to store a plurality of second address bits. The plurality of compare circuits may each be configured to generate an output signal in response to one of said plurality of first address bits and one of said plurality of second address bits. The output signals are generally each at either (i) the same logic state or (ii) a high-Z state.

18 Claims, 2 Drawing Sheets

WIRED ADDRESS COMPARE CIRCUIT AND METHOD

FIELD OF THE INVENTION

The present invention relates to a method and/or architecture for implementing an address compare generally and, more particularly, to a method and/or architecture for implementing a wired AND (or wired OR) address compare.

BACKGROUND OF THE INVENTION

Conventional address compare circuitry uses standard two and three input logic gates to AND two addresses together. Such conventional approaches use silicon area inefficiently and require a large amount of routing, particularly for a large register. The AC power drawn by such conventional circuits is due to the larger gate area switched on each clock cycle.

SUMMARY OF THE INVENTION

The present invention concerns an apparatus comprising a first register, a second register and a plurality of compare circuits. The first register may be configured to store a plurality of first address bits. The second register may be configured to store a plurality of second address bits. The plurality of compare circuits may each be configured to generate an output signal in response to one of said plurality of first address bits and one of said plurality of second address bits. The output signals are generally each at either (i) the same logic state or (ii) a high-Z state.

The objects, features and advantages of the present invention include providing a method and/or architecture for an address compare circuit that may (i) reduce routing requirements of compare circuits, (ii) provide reduced logic complexity, (iii) reduced die area, (iv) reduce routing and switching gate capacitance, (v) lower current consumption (ICC), and/or (vi) eliminate or reduce DC power consumption.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Figure 1:
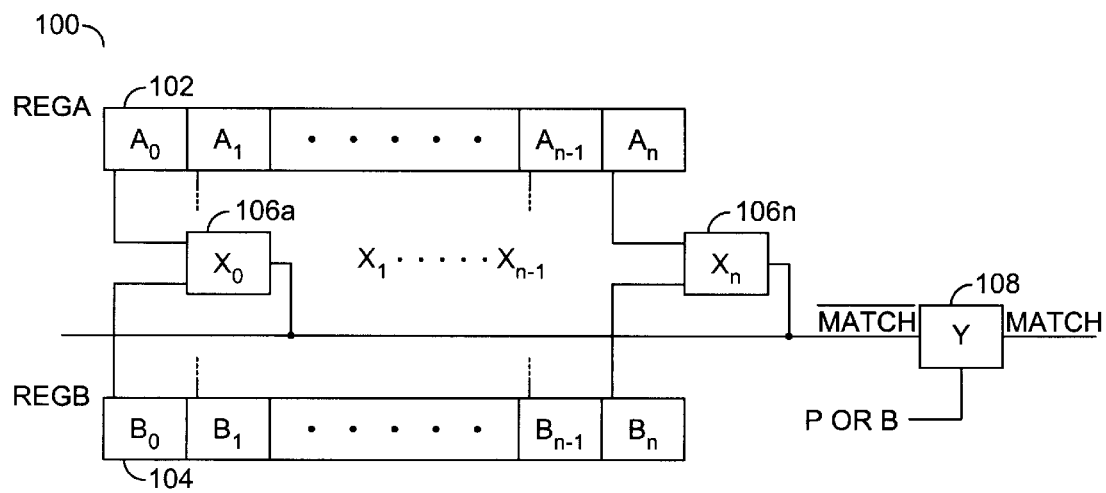
FIG. 1 is a block diagram of a preferred embodiment of the present invention.

Referring to FIG. 1, a block diagram of a circuit 100 is shown in accordance with a preferred embodiment of the present invention. The circuit 100 generally comprises a register 102 (e.g., REGA) and a register 104 (e.g., REGB). The register 102 may store a number of address bits (e.g., A0–An, where n is an integer). The register 104 store a number of address bits (e.g., B0–Bn, where n is an integer). The circuit 100 may additionally comprise a number of compare circuits 106a–106n, where n is an integer, and an output circuit 108. The register 102 may present the bit A0 to the compare circuit 106a. The register 104 may present the bit B0 to the compare circuit 106a. The compare circuit 106a may present a signal (e.g., MATCHb). The additional compare circuits 106b–106n may receive the additional bits A1–An from the register 102 and the additional bits B1–Bn from the register 104. In general, each of the compare circuits 106a–106n may receive one of the bits A0–An and one of the bits B0–Bn.

In one example, the compare circuits 106a–106n may each be implemented as an address compare circuits. The circuit 100 may determine whether there is a match between particular bits of the address register 102 and the address register 104. The compare circuits 106a–106n may each present the signal MATCHb in response to particular matches. In general, only one of the compare circuits 106a–106n may present the signal MATCH at a particular time.

Low current memories (e.g., the NOBL™ architecture commercially available from Cypress Semiconductor Corp.) may require a compare between two sets of address registers. The circuit 100 may provide such a compare architecture. The compare circuits 106a–106n may determine where the output data for a particular address has been read from. The circuit 100 may utilize the fact that only two of address bits A0–An (or B0–Bn) stored in the address register 102 (or the address register 104) may change states during a particular clock cycle. As a result, the compare circuit 106a–106n may allow a single line to carry the signal MATCHb to the output circuit 108. The circuit 100 may provide reduced gate capacitance switching. Additionally, the circuit 100 may draw less AC power.

Figure 2:
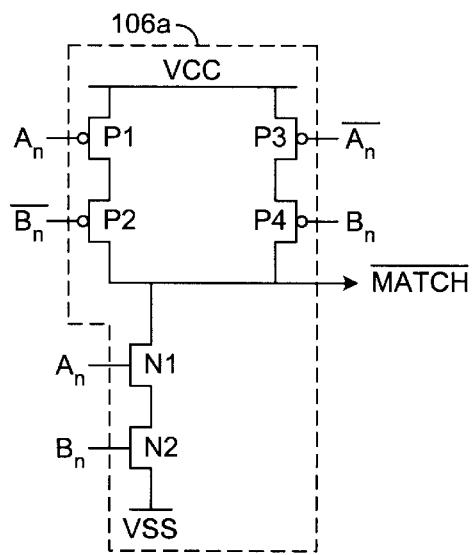
FIG. 2 is a detailed diagram of a one of the compare circuits of FIG. 1

Referring to FIG. 2, a detailed diagram of the compare circuit 106a is shown. The compare circuits 106b–106n may have similar implementations. The compare circuit 106a a transistor P1, a transistor P2, a transistor P3, a transistor P4, a transistor N1, and a transistor N2. In one example, the transistor P1 and the transistor P2 may be implemented as a transistor branch; the transistor P3 and the transistor P4 may be implemented as a transistor branch; and the transistor N1 and the transistor N2 may be implemented as a transistor branch.

The transistors P1 and P3 generally have a source that is coupled to a supply voltage (e.g., VCC). A drain of the transistor P1 is generally connected to a source of the transistor P2. A drain of the transistor P2 is generally connected to a signal (e.g., MATCHb). A drain of the transistor P3 is generally connected to a source of the transistor P4. A drain of the transistor P4 generally receives the signal MATCHb. A source of the transistor N1 may receive the signal MATCHb. A source of the transistor N2 may be connected to a drain of the transistor N1. The transistor N2 may have a drain connected to ground (e.g., VSS) The transistors P1, P2, P3 and P4 may be implemented, in one example, as P-channel transistors. The transistors N1 and N2 may be implemented, in one example, as N-channel transistors. However, other transistor types may be implemented accordingly to meet the design criteria of a particular implementation.

The transistors P1 and N1 generally receive the signal A. The transistors P4 and N2 generally receive the signal B. The transistor P2 generally receives a digital complement (e.g., Bb) of the signal B. The transistor P3 generally receives a digital complement (e.g., Ab) of the signal A. The particular polarities of the on (e.g., asserted) and off (e.g., de-asserted) states of the signal A and the signal B, as well as the polarities of the various transistors may be adjusted (e.g., reversed) accordingly to meet the design criteria of a particular implementation. The circuit 110 may present the signal MATCHb in response to the signal A and the signal B.

In one example, the address compare circuit Xn generally receives a first input from the bit An of the address register 102 and a second input from the bit Bn of the address register 104. When the bit An and the bit Bn are both at a first logic level (e.g., a logic level 1) the output from the compare circuit 106n will generally be at a second logic level (e.g., a logic level 0), generally indicating a match. When the bit An and the bit Bn are both at the second logic level (e.g., a logic level 0), the output from the compare circuit 106n will be High-Z (or Tristate). Such a High-Z state generally indicates a don't care in determining status of the signal MATCHb. When one of the bits An and Bn is at the first logic level (e.g., a logic level 1) and the other is at the second logic level (e.g., a logic level 0), the output of the compare circuit 106n will generally be at the logic level 1, which generally indicates a non match. The outputs from each of the address compare circuits 106a–106n are generally wired together before being presented to the input of the output circuit 108.

The address register 102 is generally configured such that only one of the bits A0–An is at a first logic level (e.g., a logic level 1) and the rest of the bits A0–An are at a second logic level (e.g., a logic level 0). The register 104 is generally configured such that only one of the bits B0–Bn is a first logic level (e.g., a logic level 1) and the rest of the bits B0–Bn are at a second logic level (e.g. a logic level 0). With such a configuration when the bit An and Bn both contain the first logic level (e.g., a logic level 1), the associated address compare circuit 106n will generally set the combined output signal from each of the address compare circuits 106a–106n to the second logic level (e.g., a logic level 0), generally indicating a match. When one of the address compare circuits 106a–106n indicates a match, all of the other address compare circuits 106a–106n will be in tristate mode and will not attempt to set a logic level of the signal MATCHb. When one of the bits An and Bn contains the second logic level (e.g., logic level 0) and the other bit contains the first logic level (e.g., a logic level 1), the associated address compare circuit 106n will generally present the first logic level (e.g., a logic level 1) on the combined (e.g., wired) output signal MATCHb, generally indicating a non-match. During such a condition, the other address compare circuits 106a–106n will either be (i) in tristate or (ii) also attempt to present the first logic level (e.g., a logic level 1) on the signal MATCHb.

Figure 3:
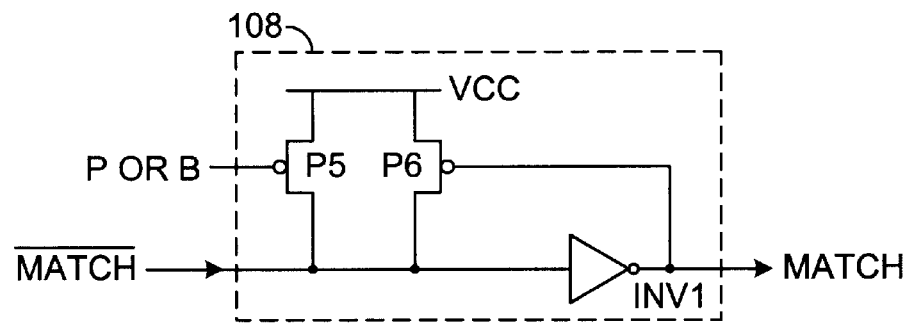
FIG. 3 is a detailed diagram of the output circuit of FIG. 1.

Referring to FIG. 3, a detailed diagram of the circuit 108 is shown. The circuit 10 generally comprises a transistor P5, a transistor P6, and an inverter (e.g., INV1). The signal MATCHb is generally presented to a drain of the transistor P5, a drain of the transistor P6 and to the inverter INV1. The transistor P5 may have a source connected to the supply voltage VCC. The transistor P6 may also have a source connected to the supply voltage VCC. The signal PORb may be presented to a gate of the transistor P5. The signal MATCH may be presented to a gate of the transistor P6. The circuit 112 may present the signal MATCH that may be a digital complement of the signal MATCHb.

The circuit 100 may implement an address compare function that may utilize the fact that only two address bits (e.g., one of the bits A0–An of the register 102 and one of the bits B0–Bn of the register 104) may change during each clock cycle. Such an implementation may be used to reduce AC power consumption. Additionally, since only a single line is used to connect the compare circuits 106a–106n to the output circuit 108, the circuit 100 may reduce routing required to implement address compares.

The circuit 100 may be implemented to register one or more predecoded addresses (as apposed to decoding the values on the pins). The predecoded addresses may be presented and stored as the bits A0–An of the address register 102 and the bits B0–Bn of the address register 104. The predecoded addresses may be implemented to generate a value of at least a "1". The predecoded addresses may be implemented as standard input enabled predecoded addresses. Each address registers 102 and 104 may contain decoded address states (e.g., only one register in each set is high, all the others are low). Additionally, the registers 102 ans 104 may be equal in size.

During a power-up, the signal MATCH is generally pulled high by the transistor P5. The transistor P5 is generally controlled by the signal PORb. The signal PORb may be generated by an external power-on-reset circuit (not shown). On power-up, the signal PORb may be driven high and then, after a short delay, may be driven low. The signal PORb generally remains low while the circuit 100 is powered-up. The signal MATCH is generally held high once the signal PORb is removed by a latch comprising the inverter INV1 and the transistor P6.

If a bit (e.g., An) of the register 102 and a bit (e.g., Bn) of the register 104 are both high, (e.g., a match), then the signal MATCHb may be pulled low. If the matching bits of the register 102 and the register 104 are both low, then the signal MATCHb is generally not driven by any of the compare circuits 106a–106n. If the matching bits of the register 102 and the 104 are different, (e.g., non-match), then the signal MATCHb is generally pulled high.

Because the register 102 and the register 104 contain decoded addresses, only one of the bits A0–An of the register 102 and one of the bits B0–Bn of the register 104 is generally high at a particular clock transition. When the corresponding bits of register 102 and the register 104 match, only one of the compare circuits 106a–106n is generally drives the signal MATCHb low. When the corresponding bits of register 102 and the register 104 are different, two of the compare circuits 106a–106n may drive the signal MATCHb high. In general, the registers 102 and 104 do not have more than one bit high (e.g., an illegal state) during normal operation. However, such an illegal state may occur on power-up. Therefore, both the register 102 and the register 104 are generally set to a low during power-up by the power-on reset signal PORb.

The various signals are generally "on" (e.g., a digital HIGH, or 1) or "off" (e.g., a digital LOW, or 0). However, the particular polarities of the on (e.g., asserted) and off (e.g., de-asserted) states of the signals may be adjusted (e.g., reversed) accordingly to meet the design criteria of a particular implementation.

The present invention may implement the address compare circuit 106 for decoded addresses. The present invention may greatly reduce routing for compare circuits, since only one wire is generally required (e.g., presented to the input of the output circuit 108) for any number of bits in the registers 102 and the register 104. The present invention may reduce logic complexity over conventional implementations using standard CMOS gates, thereby reducing area, routing and switching gate capacitance. Reduced switching gate capacitance generally results in lower current consumption (ICC). The circuit 100 may draw little or no DC power.

Figure 4:
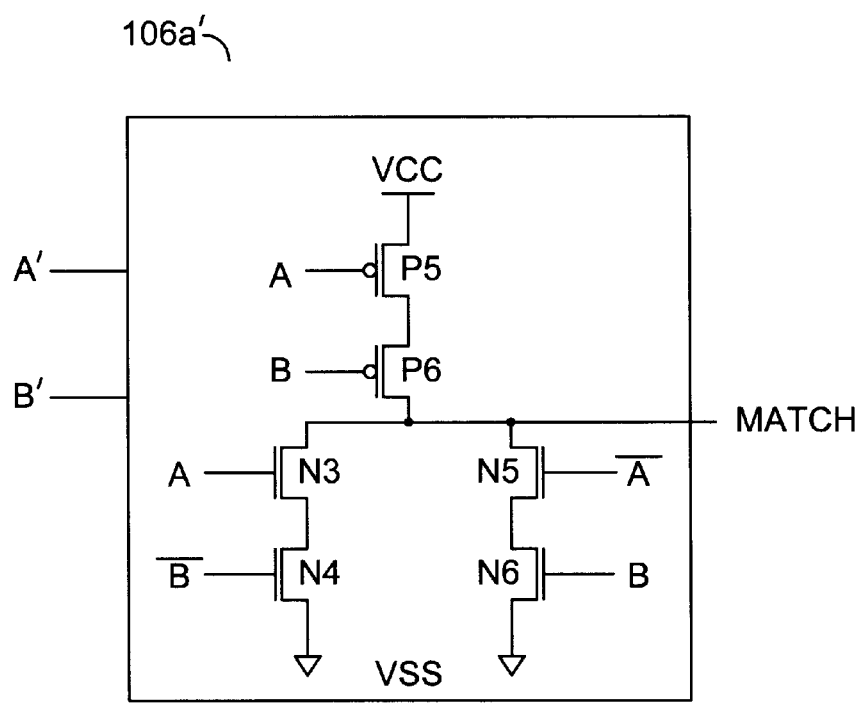
FIG. 4 is a schematic of an alternate embodiment of one of the compare circuits in accordance with the present invention.

Referring to FIG. 4, an alternate embodiment of a circuit 106a' is shown. A number of compare circuits 106b'–106n' may be implemented, similar to the compare circuits 106a–106n. The compare circuit 106a' generally comprises a transistor P5, a transistor P6, a transistor N3, a transistor N4, a transistor N5, and a transistor N6. The transistors P5 and P6 may be implemented, in one example as P-channel transistors. The transistors N3, N4, N5 and N6 may be implemented, in one example, as N-channel transistors. However, other transistor types may be implemented accordingly to meet the design criteria of a particular implementation.

The transistors P5 and N3 generally receive the signal A. The transistors P6 and N6 generally receive the signal B. The transistor N4 generally receives a digital complement (e.g., Bb) of the signal B. The transistor N5 generally receives a digital complement (e.g., Ab) of the signal A. The particular polarities of the on (e.g., asserted) and off (e.g., de-asserted) states of the signal A and the signal B, as well as the polarities of the various transistors may be adjusted (e.g., reversed) accordingly to meet the design criteria of a particular implementation.

While the invention has been particularly shown and described with reference to the preferred embodiments thereof, it will be understood by those skilled in the art that various changes in form and details may be made without departing from the spirit and scope of the invention.

What is claimed is:

1. An apparatus comprising:
   a first register configured to store a plurality of first address bits;
   a second register configured to store a plurality of second address bits; and
   a plurality of compare circuits, each configured to generate an output signal in response to one of said plurality of first address bits and one of said plurality of second address bits, wherein said output signals are each at either (i) the same logic state or (ii) a high-Z state.

2. The apparatus according to claim 1, further comprising:
   an output circuit configured to generate a global output signal in response to said plurality of output signals.

3. The apparatus according to claim 2, wherein said first register and said second register are the same size.

4. The apparatus according to claim 3, wherein only one address in said first register is at a first logic state, one address in said second register is at said first logic state and all other addresses are at a second logic state.

5. The apparatus according to claim 2, wherein only one of said plurality of compare circuits is configured to generate one of said output signals at a time.

6. The apparatus according to claim 2, wherein said apparatus draws no DC power.

7. The apparatus according to claim 2, wherein said global output signal comprises a match signal.

8. The apparatus according to claim 7, wherein said global output signal is further generated in response to a power-on reset signal.

9. The apparatus according to claim 2, wherein said compare circuit comprises:
   a first branch of transistors configured in response to (i) one of said first address bits and (ii) a digital complement of one of said second address bits;
   a second branch of transistors configured in response to (i) a digital complement of one of said first address bits and (ii) one of said second address bits; and
   a third branch of transistors configured in response to (i) one of said first address bits and (ii) one of said second address bits.

10. The apparatus according to claim 9, wherein:
    said first branch of transistors comprises one or more P-channel transistors;
    said second branch of transistors comprises one or more P-channel transistors; and
    said third branch of transistors comprises one or more N-channel transistors.

11. The apparatus according to claim 2, wherein said compare circuit comprises:
    a first branch of transistors configured in response to (i) one of said first address bits and (ii) one of said second address bits;
    a second branch of transistors configured in response to (i) one of said first address bits and (ii) a digital complement of one of said second address bits; and
    a third branch of transistors configured in response to (i) a digital complement of one of said first address bits and (ii) one of said second address bits.

12. The apparatus according to claim 11, wherein:
    said first branch of transistors comprises one or more P-channel transistors;
    said second branch of transistors comprises one or more N-channel transistors; and
    said third branch of transistors comprises one or more N-channel transistors.

13. The apparatus according to claim 8, wherein said output circuit comprises:
    a first transistor configured in response to said power on reset signal;
    a second transistor configured in response to said global output signal; and
    an inverter configured to generate said global output signal in response to said output signal.

14. The apparatus according to claim 13, wherein:
    said first transistor is a P-channel transistor; and
    said second transistor is a N-channel transistor.

15. An apparatus comprising:
    means for storing a plurality of first address bits;
    means for storing a plurality of second address bits; and
    means for generating a plurality of output signals, each in response to one of said plurality of first address bits and one of said plurality of second address bits; and
    means for generating a global output signal in response to said plurality of output signals, a control signal, and a power-on-reset signal, wherein said output signals are each at either (i) the same logic state or (ii) a high-Z state.

16. A method for comparing a plurality of bits of an address comprising the steps of:
    (A) storing a plurality of first address bits;
    (B) storing a plurality of second address bits;
    (C) generating a plurality of output signals in response to one of said plurality of first address bits and one of said plurality of second address bits, wherein said output signals are each at either (i) the same logic state or (ii) a high-Z state; and
    (D) generating a global output signal in response to said plurality of output signals, a control signal and power-on-reset signal.

17. The method according to claim 16, wherein said method draws no DC power.

18. The method according to claim 16, wherein said global output signal comprises a match signal.

* * * * *